(12) United States Patent
Matsushita

(10) Patent No.: US 7,106,144 B2
(45) Date of Patent: Sep. 12, 2006

(54) SEMICONDUCTOR INTEGRATED CIRCUIT

(75) Inventor: Rumi Matsushita, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 10/400,011

(22) Filed: Mar. 26, 2003

(65) Prior Publication Data
US 2003/0184392 A1 Oct. 2, 2003

(30) Foreign Application Priority Data
Mar. 27, 2002 (JP) .............................. 2002/089138

(51) Int. Cl.
H03B 1/00 (2006.01)

(52) U.S. Cl. .................... 331/74; 331/175; 331/116 R; 331/116 FE

(58) Field of Classification Search ............... 331/158, 331/108 R, 74, 116 R, 116 FE, 175
See application file for complete search history.

(56) References Cited

U.S. PATENT DOCUMENTS

| 4,134,085 A | 1/1979 | Driscoll et al. ......... 331/116 R |
| 5,187,453 A | 2/1993 | Aoyangi et al. ....... 331/116 FE |
| 5,369,311 A | 11/1994 | Wang et al. ................. 327/292 |
| 5,654,645 A | 8/1997 | Lotfi ........................... 326/24 |
| 6,690,245 B1 * | 2/2004 | Hasegawa et al. .......... 331/158 |

FOREIGN PATENT DOCUMENTS

| EP | 0 599 015 A1 | 6/1994 |
| JP | 63-87814 | 4/1988 |
| JP | 63-139408 | 6/1988 |
| JP | 2-174248 | 7/1990 |
| JP | 2-228106 | 9/1990 |
| JP | 6-343025 | 12/1994 |
| JP | 11-17452 | 1/1999 |
| JP | 11-146727 | 5/1999 |
| JP | 2001-136030 | 5/2001 |
| JP | 465869 | 11/2001 |

OTHER PUBLICATIONS

Microfilm of Japanese Utility Model Application 63-4042 (Japanese Laid-Open Utility Model Application No. 1-108623, dated Jul. 24, 1989).
Microfilm of Japanese Utility Model Application 63-4043 (Japanese Laid-Open Utility Model Application No. 1-108624, dated Jul. 24, 1989).

* cited by examiner

Primary Examiner—Arnold Kinkead
(74) Attorney, Agent, or Firm—Scully, Scott, Murphy & Presser, P.C.

(57) ABSTRACT

An oscillating section 110 comprised of feedback inverter INV1 and a feedback resistor R2, and a waveform shaping section 120 including a Schmitt circuit S1 of which transistors P3 and N3 respectively receive, as gate control signals, signals Gp3 and Gn3 generated by a stable-oscillation signal A1 and logic elements AND1, OR1 and INV3, respectively, and the supply of power to the waveform shaping section 120 is performed through a low pass filter 111 comprised of a resistor R1 and a capacitor C1 and thus a high potential power source VDD is supplied to the waveform shaping section 120 as a high potential power source VDDX.

9 Claims, 7 Drawing Sheets

SEMICONDUCTOR INTEGRATED CIRCUIT

BACKGROUND OF THE INVENTION

1. Field of the Invention

The invention relates to semiconductor integrated circuits, and more particularly to a semiconductor integrated circuit containing an oscillator and reducing Electro-Magnetic interference (hereinafter, abbreviated to EMI) noise produced by the oscillator.

2. Description of the Prior Art

As is well known, smaller sets of electrical equipment are introduced because of the recent technical trend of module integration that is proceeding in the automotive electrical equipment industry. This leads to an increasing demand for reducing EMI noise in FM band/keyless band (Rf band) of the individual semiconductor integrated circuits (semiconductor devices) installed in the set, which is also well known.

It is also well known that a variety of factors are responsible for EMI noise of such semiconductor integrated circuits.

EMI noise caused by an oscillator integrated in the above described semiconductor integrated circuit is always emitted in almost all the operating modes thereof except when the oscillator is in a standby mode to be stopped. Therefore, the reduction of noise caused by the oscillator is one of the challenges for the reduction of EMI noise.

A semiconductor integrated circuit containing such a conventional oscillator is disclosed, for example, in Japanese Patent Laid-Open No. 02-228106.

FIG. 1 is a block diagram of a semiconductor integrated circuit containing a conventional oscillator. In a semiconductor integrated circuit 900 containing a conventional oscillator, an output A1 from an oscillating section 910 is input to a waveform shaping section 920 including a Schmitt circuit S8, and an output signal 925 is output via an output buffer BUF 5.

The Schmitt circuit S8 is inserted for the purpose of blocking noise superimposed on output from the oscillating section 910, and it serves to increase Electro-Magnetic susceptibility (hereinafter, abbreviated to EMS) characteristic. In addition to this, specifically in the course of oscillation growth from the start of oscillation, the Schmitt circuit serves to reduce EMI noise caused by through-current by eliminating changes in its state in the case in which the output A1 from the key oscillating section 910 is at the intermediate potential.

FIG. 2 shows the results of Fast Fourier transform (hereinafter, abbreviated to FFT) analyses of an oscillation power-source current Ivddosc flowing through the oscillation circuit and a waveform-shaping section power-source current Ivdd flowing through the waveform shaping section including the Schmitt circuit when the semiconductor integrated circuit containing the conventional oscillator shown in FIG. 1 is in stable oscillation.

Also, FIG. 3 shows current waveforms at that time. In the conventional oscillator, the oscillation power-source current Ivddosc flowing through the oscillation circuit in stable oscillation has a peak at the oscillation frequency of a point P, and the spectra fall downward with increasing frequency.

This is because a current flowing through a feedback inverter within the oscillating section changes smoothly as shown in the oscillation power-source current Ivddosc of FIG. 3, due to the fact that the output A1 of the key oscillating section exhibits a waveform close to a sine wave, wherein the current flowing through the feedback inverter is caused by through-current and charging current into capacitance including internal and external parasitic capacitance. In contrast to this, although the waveform-shaping section power-source current Ivdd has a lower spectrum in the vicinity of the point P, its spectra does not fall in strength to the high frequency region, exhibiting a spectrum distribution that is nearly white.

In the Schmitt circuit S8, transistor element P13 and N13 are constantly switched according to feedback signals, and their through-current also complicatedly change with changes in gm of the transistor elements. Because a signal with a rectangular waveform shaped by the Schmitt circuit S8 is input to the output buffer (BUF5) connected to the following stage, the through-current of the buffer becomes steep. Therefore, the waveform-shaping section power-source current Ivdd flowing through the waveform shaping section becomes steep and complicated, as shown in the waveform-shaping section power-source current Ivdd of FIG. 3, and thus its spectra spreads to the high frequency region.

Also, semiconductor integrated circuits containing the conventional oscillator as described above are further disclosed in Japanese Patent Laid-Open No. 02-174248 and Japanese Patent Laid-Open No. 11-145727.

However, the conventional prior art has a problem that the insertion of the Schmitt circuit contrary increases EMI noise due to the following reasons.

In other words, there is a problem in which the insertion of the Schmitt circuit deteriorates EMI characteristics in the high frequency region because of an increased through-current induced by the adding of transistor element itself and the complicated current characteristics of the Schmitt circuit.

Further, as measures against EMI, a typical, known method is to insert a pass capacitor near a noise source. However, in the case of the oscillator, there is also a problem that insertion of a pass capacitor in the vicinity of the oscillator, is not so effective for the reduction of noise produced by the waveform shaping section including the Schmitt circuit since the capacitor is mostly used for charging and discharging of the feedback inverter within the oscillating section, as shown for the oscillation power-source current Ivddosc in FIG. 3.

SUMMARY OF THE INVENTION

An object of the invention is to provide a semiconductor integrated circuit reducing EMI noise produced by an oscillator by dividing the oscillator into an oscillating section and a waveform shaping section.

That is, in the semiconductor integrated circuit according to the invention, the supplies of power are separated and the supply of power to the waveform shaping section is performed through an dedicated low pass filter, and a stable-oscillation state signal is used to control a high frequency noise source within the waveform shaping section after the oscillation becomes stable.

Further, the waveform shaping section of the semiconductor integrated circuit according to the invention includes a Schmitt circuit which has a hysteresis characteristic during the unstable period of the oscillating section in the course of oscillation growth from the start of oscillation, and which operates as a buffer circuit when the oscillating section is in the state of stable oscillation.

Furthermore, the Schmitt circuit of the semiconductor integrated circuit according to the invention has a first transistor element and a second transistor element, and during the unstable period of the oscillating section in the course of oscillation growth from the start of oscillation, the first transistor element and the second transistor element receive a feedback signal in a positive phase and the Schmitt circuit has a hysteresis characteristic.

When the oscillating section of the semiconductor integrated circuit according to the invention goes into the state of stable oscillation, the first transistor element and the second transistor element each change into the OFF state and the Schmitt circuit becomes a buffer circuit.

BRIEF DESCRIPTION OF THE DRAWINGS

This above-mentioned and other objects, features and advantages of this invention will become more apparent by reference to the following detailed description of the invention taken in conjunction with the accompanying drawings, wherein.

DETAILED DESCRIPTION OF THE PREFERRED EMBODIMENTS

Next, semiconductor integrated circuits according to the embodiments of the invention will be described in detail with reference to drawings.

The invention is characterized in that, for dealing with EMI noise produced by an oscillator, which noise has been a problem with the prior art, the oscillator is divided into an oscillating section and a waveform shaping section and the supplies of power to their sections are separated, thus providing the supply of power to the waveform shaping section through a dedicated low path filter, and further a stable-oscillation state signal is used to control a high frequency noise source within the waveform shaping section after the oscillation becomes stable.

Figure 1:
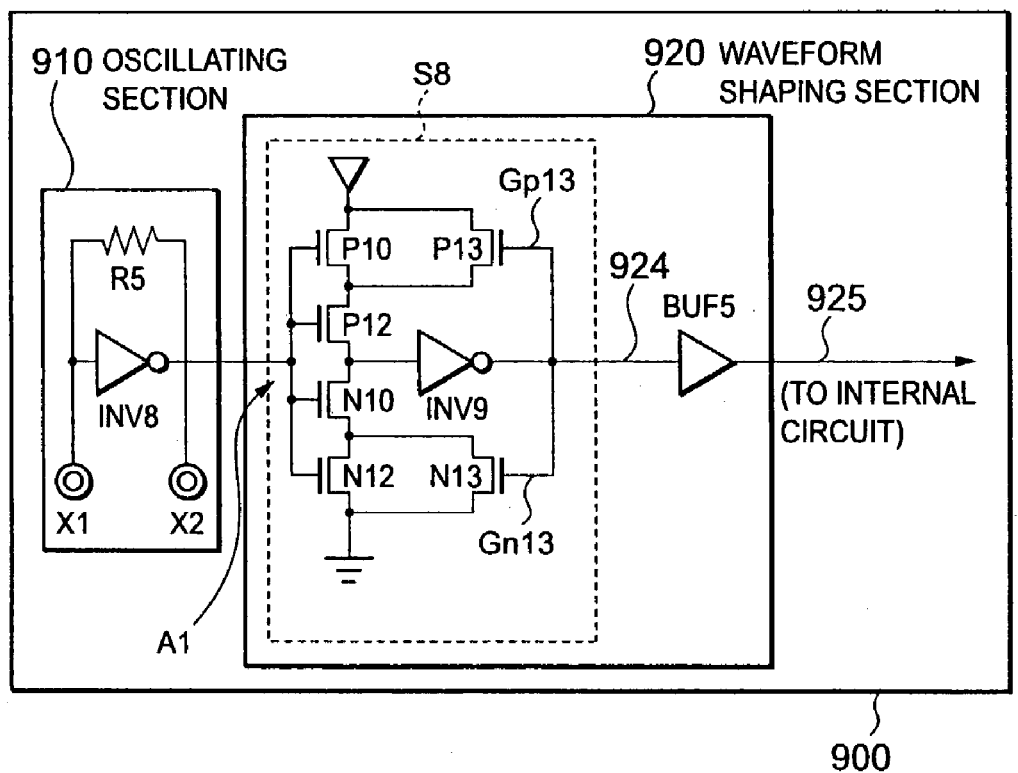
FIG. 1 is a block diagram for showing a configuration of a conventional semiconductor integrated circuit.
Figure 2:
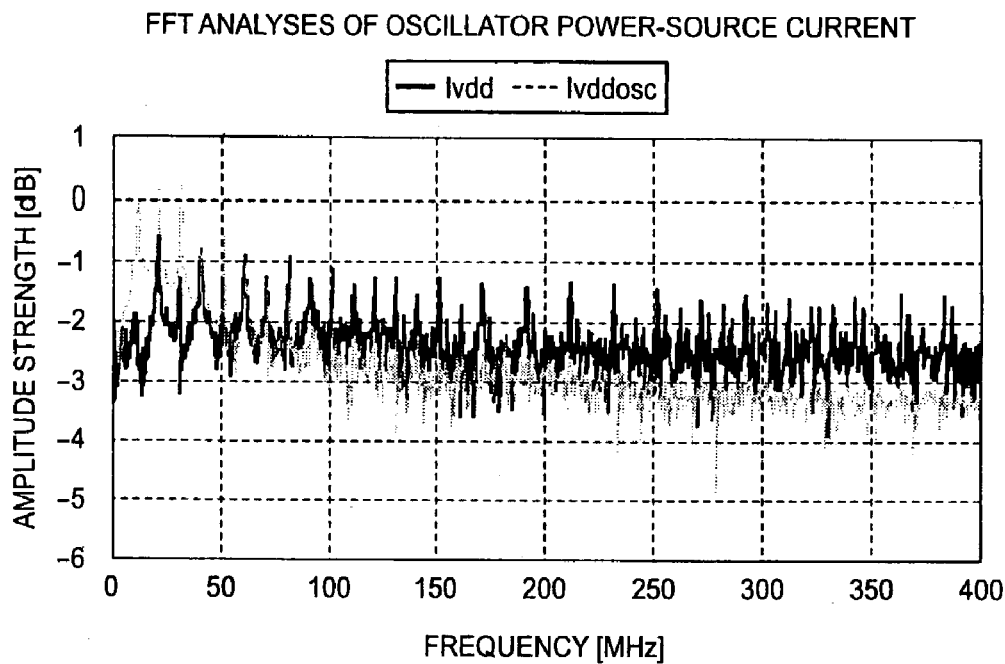
FIG. 2 is a diagram for showing the results of FFT analyses of the oscillating section of the conventional semiconductor integrated circuit.
Figure 3:
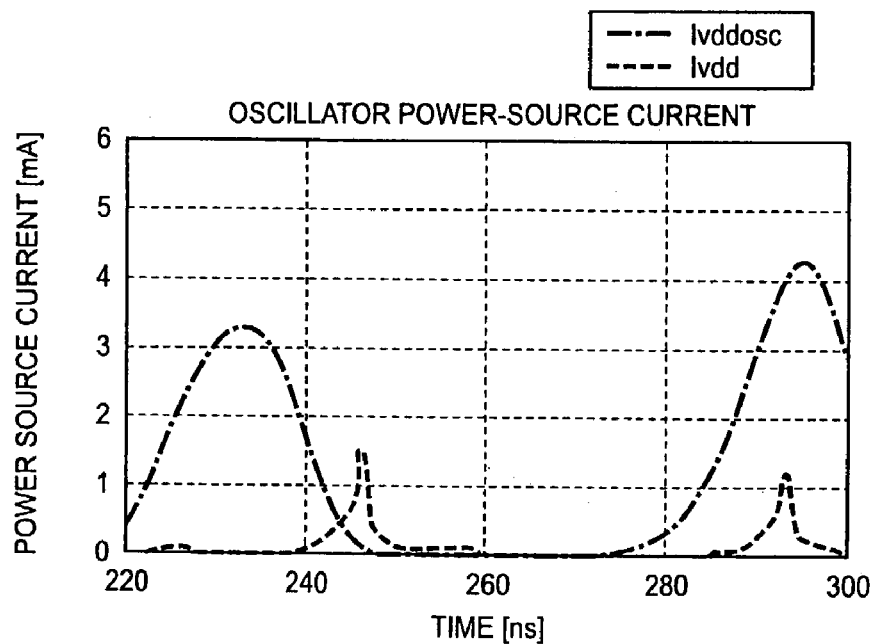
FIG. 3 is a diagram for showing the waveforms of the power-source currents of the oscillating section of the conventional semiconductor integrated circuit.
Figure 4A:
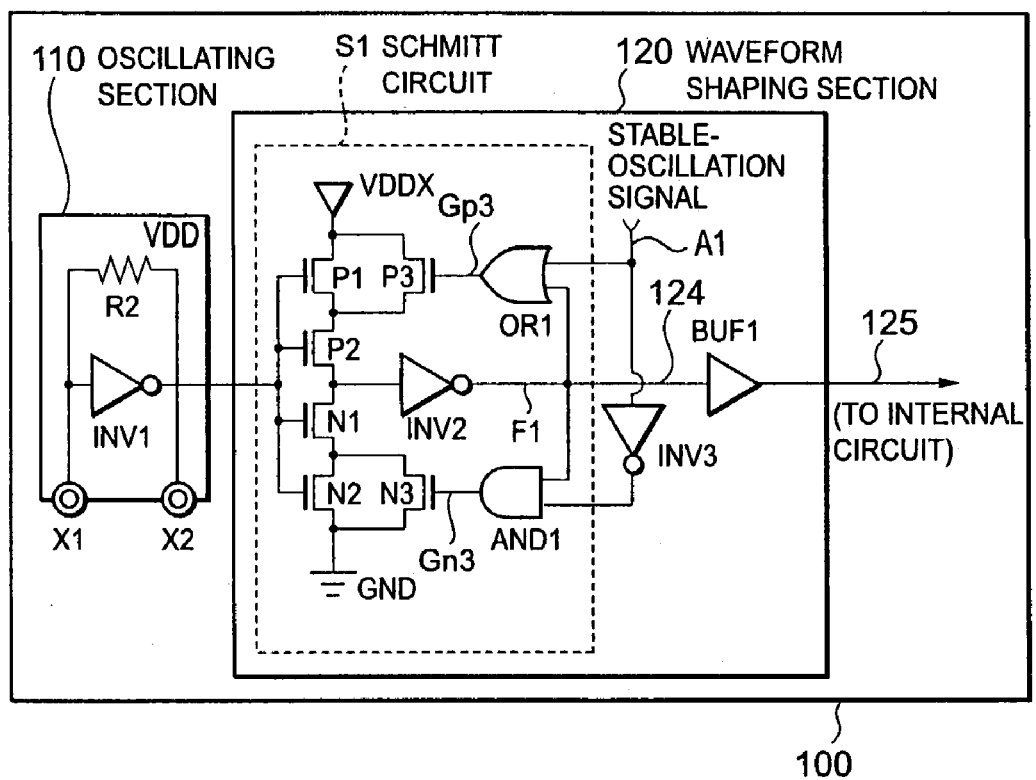
FIG. 4A is a block diagram for showing a detailed configuration of a semiconductor integrated circuit according to a first embodiment of the invention.
Figure 4B:
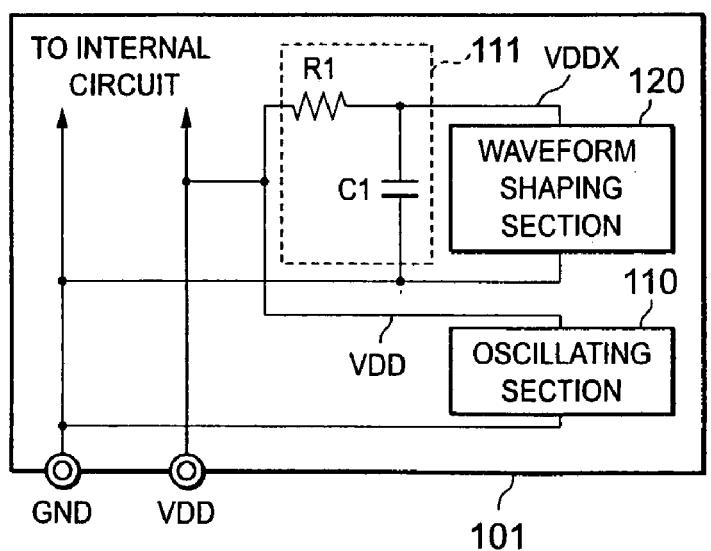
FIG. 4B is a block diagram for showing a configuration for the supply of power of the semiconductor integrated circuit according to the first embodiment of the invention.

FIG. 4A is a block diagram for showing a detailed configuration of a semiconductor integrated circuit according to a first embodiment of the invention, and FIG. 4B is the configuration of the supply of power thereto.

Referring to FIG. 4A, in a semiconductor integrated circuit 100 according to the first embodiment of the invention, the built-in oscillation circuit comprises an oscillating section 110 consisting of a feedback inverter INV1 and a feedback resistor R2, and a waveform shaping section 120.

Further, the supplies of power are separately provided to the oscillating section 110 and waveform shaping section 120, respectively. That is, referring to FIG. 4B, the supply of power to the waveform shaping section 120 is provided through a low pass filter 111 comprised of a resistor R1 and a capacitor C1, wherein a high potential power source VDD is supplied to the waveform shaping section as a high potential power source VDDX.

Also, transistor element P3 and N3 of a Schmitt circuit S1 in the waveform shaping section 120 are respectively connected to receive, as the respective gate control signals, signals Gp3 and Gn3 produced by a stable-oscillation signal A1 and logic elements AND1, OR1, and INV3. The output of a stable-oscillation timer and the like is used as the stable-oscillation signal A1.

Next, the operation of the first semiconductor integrated circuit 100 according to the first embodiment of the invention will be described.

Referring to FIG. 4A and FIG. 4B respectively, the power source of the waveform shaping section 120 in the first semiconductor integrated circuit 100 according to the first embodiment of the invention is connected to the waveform shaping section 120 through the low pass filter 111. The supply of power to the waveform shaping section 120 is separated from the oscillating section 110, and the capacitor C1 can serve effectively for the waveform shaping section 110 because the resistor R1 disposed between the waveform shaping section 120 and the oscillating section 110 limits the discharging current of the capacitor C1 to the oscillating section 110, which consumes a large amount of current.

Also, because the current consumed by the waveform shaping section 120 is typically less than that consumed by the oscillating section 110, the capacitor C1 only requires a small value of capacitance. That is, by the separation of power source supplied to both sections and the insertion of a resistor between both sections, it becomes possible that a small amount of capacitance reduce the sneaking amount of high frequency noise produced by the waveform shaping section into the power source line.

In the unstable course of oscillation growth from the start oscillation in which the stable-oscillation signal A1 is at a LOW level, a feedback signal F1 is transmitted in a positive phase to the transistor elements P3 and N3 and the Schmitt circuit S1 operates as a normal Schmitt circuit having a hysteresis characteristic. When the oscillator 110 goes into the state of stable oscillation and the stable-oscillation signal then becomes High, the gate signal Gp3 to the transistor element P3 becomes HIGH and the gate signal Gn3 to the transistor element N3 becomes LOW, thereby causing the transistors P3 and N3 each to be in the state of OFF.

That is, after the oscillation becomes stable, the Schmitt circuit S1 operates as a normal buffer not having a hysteresis characteristic. The transistor element P3 and N3 becomes OFF, whereby the waveform of through-current flowing through the Schmitt circuit S1 becomes low in its peak value and also becomes simple in its waveform, thereby reducing high frequency power source noise caused by the Schmitt circuit.

Figure 7:
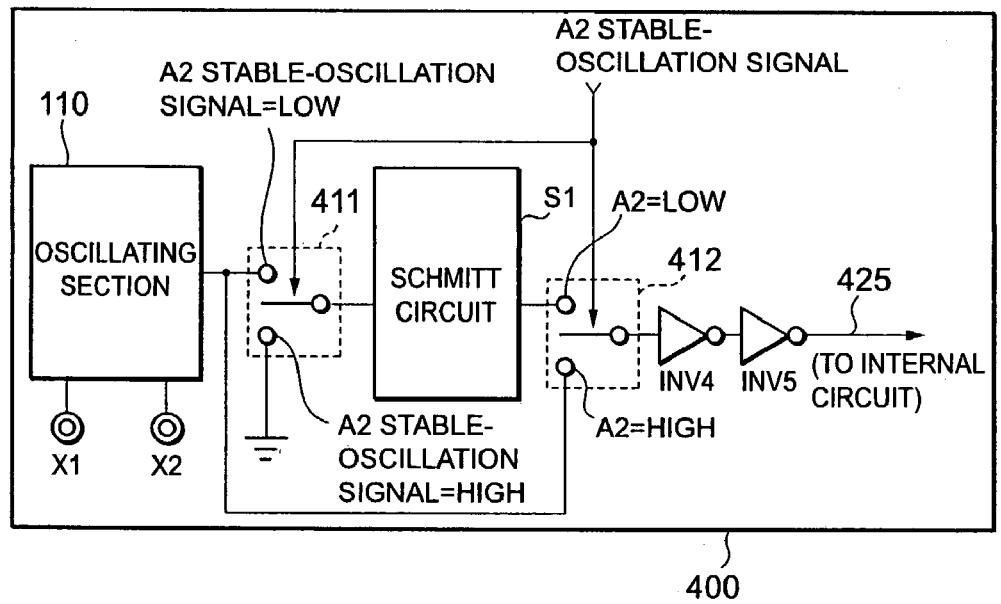
FIG. 7 is a block diagram for showing a configuration of a semiconductor integrated circuit according to a second embodiment of the invention.

Next, a semiconductor integrated circuit according to a second embodiment of the invention will be described. FIG. 7 is a block diagram for showing a semiconductor integrated circuit according to a second embodiment of the invention.

When compared to the semiconductor integrated circuit according to the first embodiment of the invention, the semiconductor integrated circuit according to the second embodiment of the invention is different in that a stable-oscillation signal A2 acts to cause the Schmitt circuit to be bypassed since the oscillation became stable. The constituent elements except for those for this operation are the same as those of the semiconductor integrated circuit according to the first embodiment of the invention, and therefore the detailed descriptions thereof will be omitted.

In the semiconductor integrated circuit according to the second embodiment of the invention, when the stable-oscillation signal A2 becomes HIGH, the input of the Schmitt circuit S1 is fixed to GND, thereby operating to eliminate the through-current flowing through the Schmitt circuit S1. At this time, if the constituent elements of an inverter INV4 are in advance designed to be small in the current-driving ability, the through-current flowing through the whole of the waveform shaping section can be further decreased, and therefore it is possible to substantially suppress the production of high frequency noise.

Figure 8:
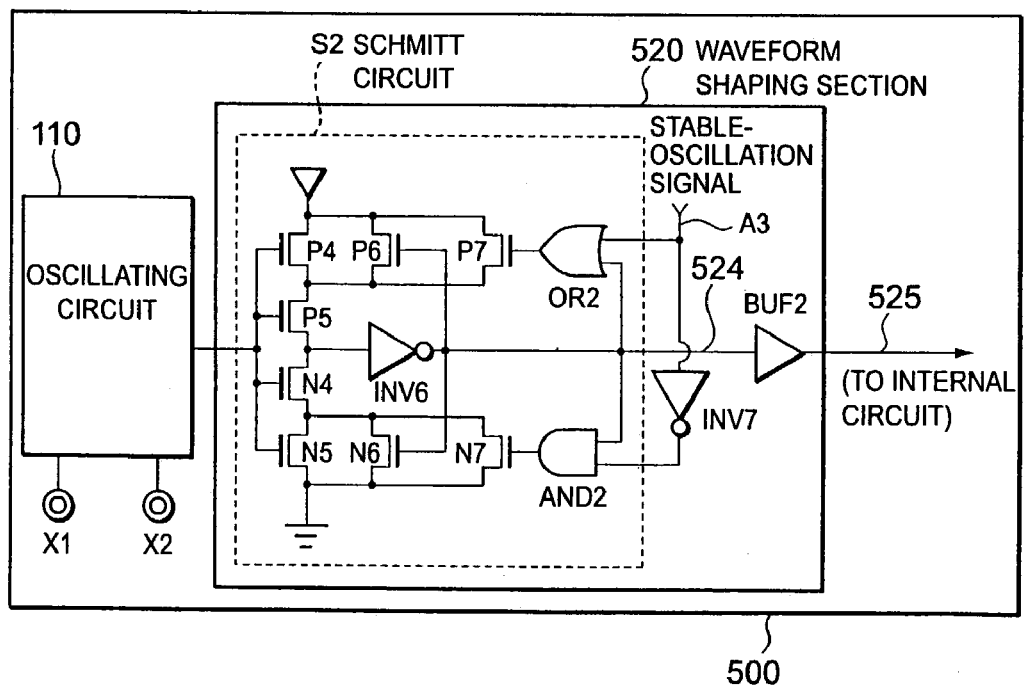
FIG. 8 is a block diagram for showing a configuration of a semiconductor integrated circuit according to a third embodiment of the invention.

Next, a semiconductor integrated circuit according to a third embodiment of the invention will be described. FIG. 8 is a block diagram for showing a semiconductor integrated circuit according to a third embodiment of the invention.

After the semiconductor integrated circuit according to the first embodiment of the invention reaches to stable oscillation, it eliminates the hysteresis characteristic of the Schmitt circuit. In contrast to this, the semiconductor integrated circuit according to the third embodiment of the invention optimizes the hysteresis characteristic.

In a the semiconductor integrated circuit 500 according to the third embodiment of the invention, after the stable-oscillation signal A3 becomes HIGH, the transistor elements P7 and N7 each become OFF, but the transistor elements P6 and N6 keep their hysteresis characteristics themselves because the output of an INV6 continues inputting thereto. However, because the transistor elements P7 and N7 become OFF, the widths of hysteresis of the transistor elements P6 and N6 are narrower than those when the stable-oscillation signal A3 is LOW, but the production of high frequency noise can be suppressed by the corresponding amount.

In general, after the oscillation becomes stable, the effect of external noise input via the oscillating section 110 is decreased because the output of the feedback inverter has an inductance component. Therefore, by suppressing to a required minimum the hysteresis width after the oscillation becomes stable, it possible to keep EMS characteristics while suppressing the production of high frequency noise.

The semiconductor integrated circuit 500 according to the third embodiment of the invention is useful for a semiconductor integrated circuit in which importance is attached to the EMS characteristic.

Figure 9:
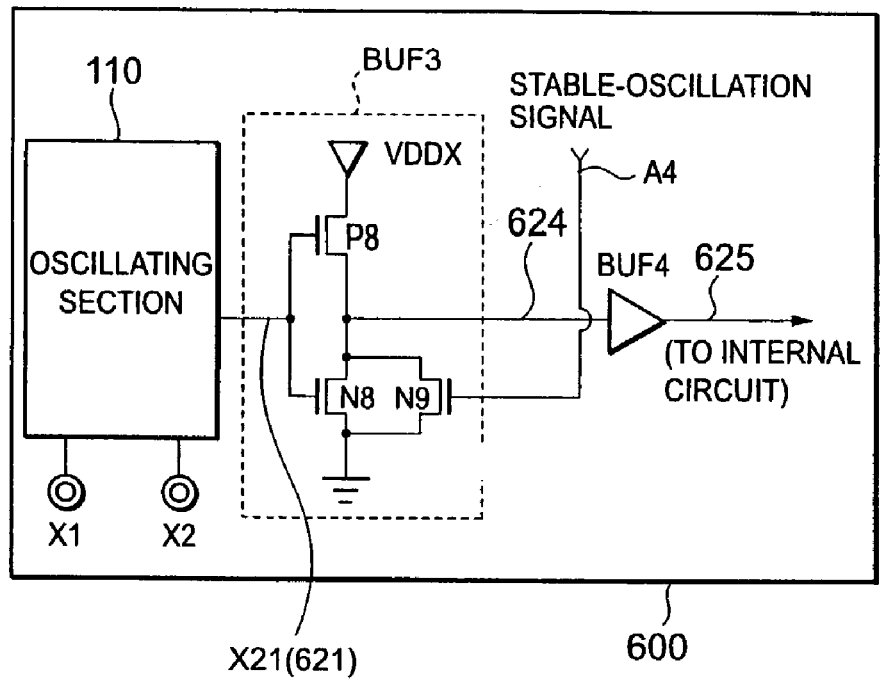
FIG. 9 is a block diagram for showing a configuration of a semiconductor integrated circuit according to a fourth embodiment of the invention.

Next, a semiconductor integrated circuit according to a fourth embodiment of the invention will be described. FIG. 9 is a block diagram for showing a semiconductor integrated circuit according to a fourth embodiment of the invention.

Figure 10:
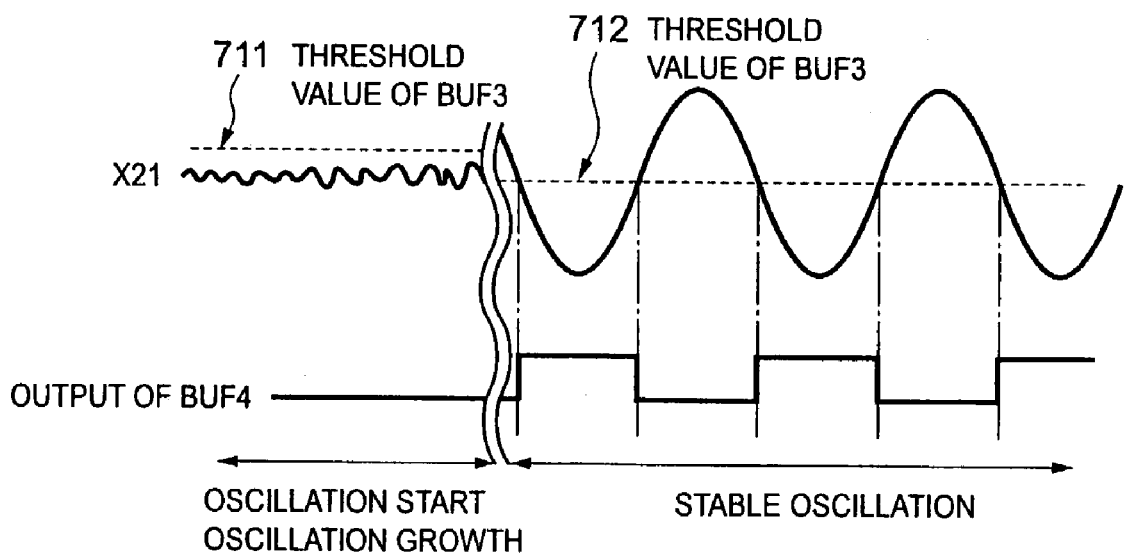
FIG. 10 is a time chart for illustrating a stable-oscillation signal in the course of oscillation growth from the start of oscillation in the operation of the semiconductor integrated circuit according to a fourth embodiment of the invention.

In a semiconductor integrated circuit 600 according to the fourth embodiment of the invention, because a stable-oscillation signal A4 is LOW in the course of oscillation growth from the start of oscillation in operation, a transist or element N9 is in the state of OFF. The transistor elements P8 and N8 are designed such that the threshold value of BUF3 at this time may deviate from the central value of the output voltage X21 (621) of the oscillating section 110, as shown in the threshold value 711 of BUF3 of FIG. 10

Deviation of the threshold value prevents a yet-to-be-grown signal X21 and external noise superimposed on a stable signal X21 from transmitting to the output of BUF4. Since the stable-oscillation signal became HIGH, a transistor element N9 has been in the ON state. By matching the threshold value of BUF3 at this time to the central value of the output voltage X21 of the oscillating section 110, as shown in the threshold value 712 of BUF3 of FIG. 10, the duty ratio of the output of BUF 4 can be made 1:1.

The semiconductor integrated circuit according to the fourth embodiment of the invention is useful for a semiconductor integrated circuit using original oscillation as-is without frequency dividing of the output of the oscillator.

Figure 11:
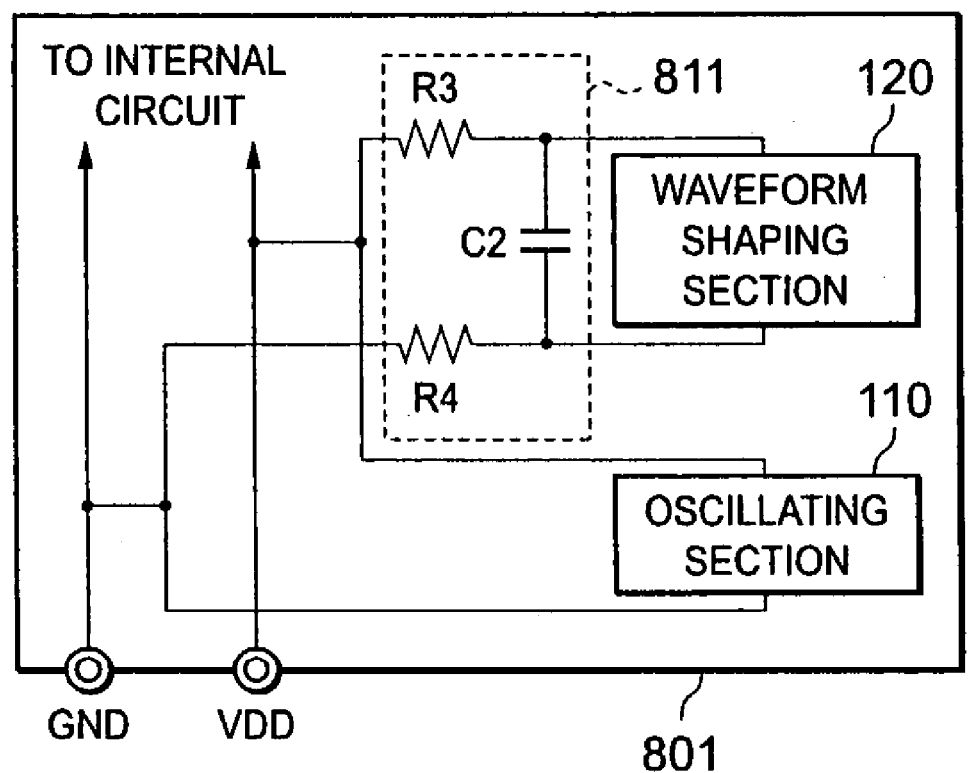
FIG. 11 is a block diagram for showing a configuration of a semiconductor integrated circuit according to a fifth embodiment of the invention.

Next, a semiconductor integrated circuit according to a fifth embodiment of the invention will be described. FIG. 11 is a block diagram for showing a semiconductor integrated circuit according to a fifth embodiment of the invention.

The semiconductor integrated circuit according to the first embodiment of the invention provides the low pass filter 111 inserted for the power source. In addition to this low pass filter, a semiconductor integrated circuit 801 according to the fifth embodiment of the invention also separates the GND line to a waveform shaping section 120 and inserts a low pass filter 811 between GND and the waveform shaping section 120 via a resistor R4. In such a manner, the waveform shaping section 120 is given a potential via the low pass filter 811, thereby preventing high frequency noise produced by the waveform shaping section 120 from sneaking into the GND line located inside and outside the semiconductor chip.

As described above, according to the invention, only a small control circuit, the separating of power source interconnection and the addition of a low pass filter can reduce the sneaking amount of high frequency power source noise caused by the oscillator waveform-shaping section into elements located inside and outside the semiconductor chip.

Further, the invention is characterized in that no effect is exerted on the key characteristics of an oscillator determined by the built-in oscillating section and an external oscillating element, because the present invention takes noise reduction measures only on the waveform shaping section.

Figure 5:
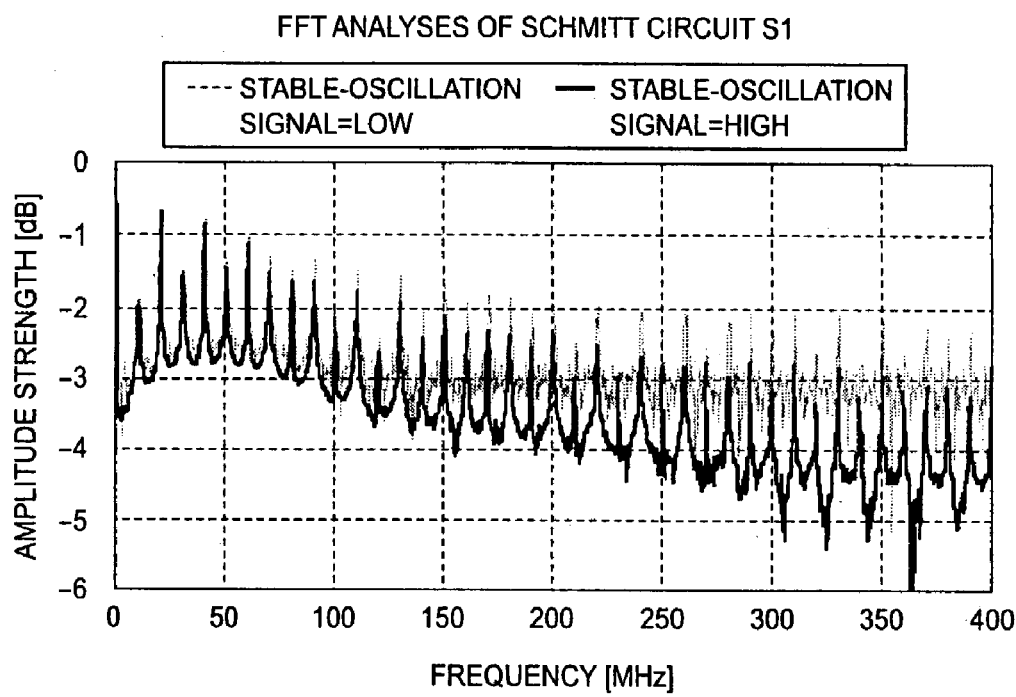
FIG. 5 is a diagram for showing the results of FFT analyses of a Schmitt circuit of the semiconductor integrated circuit according to the first embodiment of the invention.

FIG. 5 shows the results of FFT analyses for showing the comparison of the currents flowing through the Schmitt circuit S1 when the stable-oscillation signal 1 is LOW and when it is HIGH. It can be seen that when the stable-oscillation signal 1 becomes HIGH, the spectra in the high frequency region are decreased.

Figure 6:
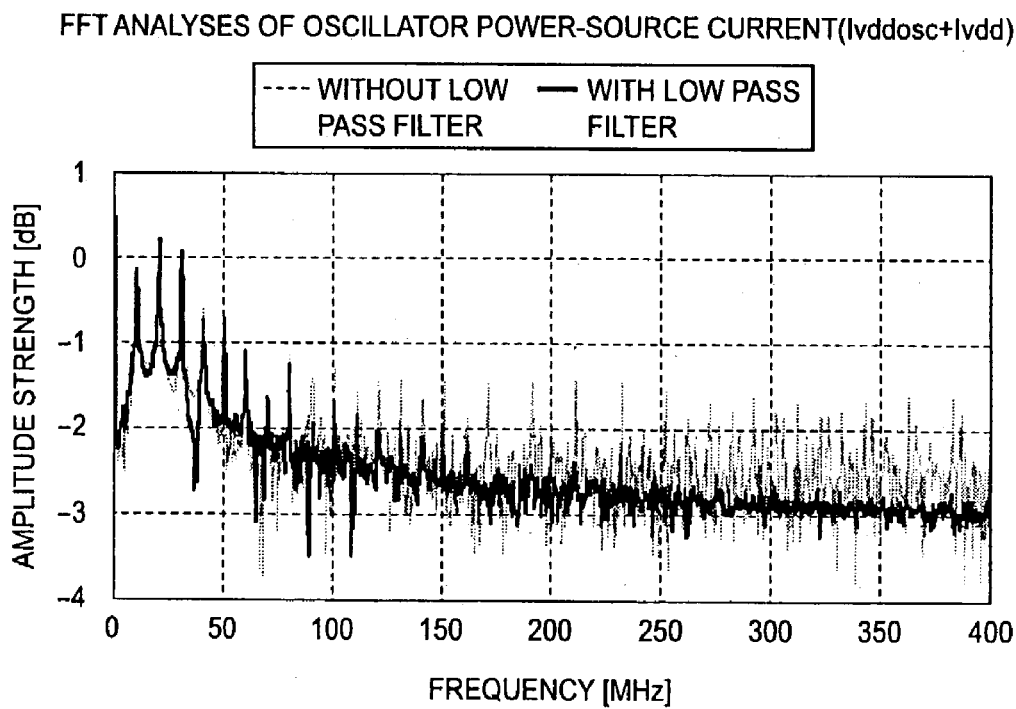
FIG. 6 is a diagram for showing the results of FFT analyses of the oscillating section of the semiconductor integrated circuit according to the first embodiment of the invention.

FIG. 6 shows the results of FFT analyses for showing the comparison of the sums of the oscillating section power-source current Ivddosc and the waveform shaping section power-source current Ivdd when the power source is separated and the low pass filter is inserted, as described in connection to the first embodiment, and when such measures are not taken. The capacitance C1 of FIG. 4B has the effect of decreasing the spectra of the high frequency region, because it can effectively act for the waveform shaping section without being used for the oscillating section 1.

What is claimed is:

1. A semiconductor integrated circuit device comprising:
   first and second power supply lines between which a power supply voltage is supplied;
   an oscillating section connected between said first and second power supply lines and operating on said power supply voltage to produce an oscillation signal;
   a waveform shaping section having first and second power nodes and operating on an internal power supply voltage supplied between said first and second power nodes to receive said oscillation signal and produce waveform-shaped oscillation signal; and
   a low pass filter connected to said first and second power supply lines and further to said first and second power nodes of said waveform shaping section to transfer said power supply voltage to said waveform shaping section as said internal power supply voltage.

2. The semiconductor integrated circuit according to claim 1, wherein said waveform shaping section includes a Schmitt circuit which has a hysteresis characteristic during the unstable period of said oscillating section in the course of oscillation growth from the start of oscillation, and which operates as a buffer circuit when said oscillating section is in the state of stable-oscillation.

3. The semiconductor integrated circuit according to claim 2, wherein said Schmitt circuit has a first transistor element and a second transistor element, and during said unstable period in said course of oscillation growth from the start of oscillation, said first transistor element and said second transistor element receive a feedback signal in a positive phase of said Schmitt circuit has a hysteresis characteristic, and wherein when said oscillating section goes into the state of stable oscillation, said first transistor element and said second transistor element each change into the OFF state and said Schmitt circuit becomes a buffer circuit.

4. The semiconductor integrated circuit according to claim 2, wherein when said oscillating section goes into the state of stable oscillation, the input of said Schmitt circuit is fixed to GND.

5. The semiconductor integrated circuit according to claim 3, wherein when said oscillating section goes into the state of stable oscillation, the input of said Schmitt circuit is fixed to GND.

6. The semiconductor integrated circuit according to claim 1, wherein said waveform shaping section includes a Schmitt circuit which has a hysteresis characteristic during the unstable period of said oscillating section in the course of oscillation growth from the start of oscillation, and which is a hysteresis characteristic narrower than a hysteresis width during said unstable period when said oscillating section goes into the state of stable-oscillation.

7. The semiconductor integrated circuit according to claim 1, wherein said waveform shaping section comprises a buffer circuit with a first transistor element and a second transistor element, and the threshold value of said buffer circuit is set to deviate from the center value of the output voltage of said oscillating section during the unstable period of said oscillating section in the course of oscillation growth from the start of oscillation.

8. The device according to claim 1, wherein said low pass filter comprises a resistor connected between said first power supply line and said first power node of said waveform shaping section and a capacitor connected between said first and second power nodes of said waveform shaping section, said second supply line being connected to said second power node of said waveform shaping section.

9. The device according to claim 1, wherein said low pass filter comprises a first resistor connected between said first power supply line and said first power node of said waveform shaping section, a capacitor connected between said first and second power nodes of said waveform shaping section, and a second resistor connected between said second supply line and said second power node of said waveform shaping section.

* * * * *